US011335595B2

(12) United States Patent
Sunamoto et al.

(10) Patent No.: US 11,335,595 B2
(45) Date of Patent: May 17, 2022

(54) METHOD OF MANUFACTURING A SEMICONDUCTOR ELEMENT FRONT SIDE ELECTRODE

(71) Applicant: Mitsubishi Electric Corporation, Tokyo (JP)

(72) Inventors: Masatoshi Sunamoto, Tokyo (JP); Ryuji Ueno, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 330 days.

(21) Appl. No.: 16/481,995

(22) PCT Filed: Feb. 7, 2018

(86) PCT No.: PCT/JP2018/004171
§ 371 (c)(1),
(2) Date: Jul. 30, 2019

(87) PCT Pub. No.: WO2018/150971
PCT Pub. Date: Aug. 23, 2018

(65) Prior Publication Data
US 2019/0393173 A1    Dec. 26, 2019

(30) Foreign Application Priority Data
Feb. 15, 2017 (JP) .............................. JP2017-025804

(51) Int. Cl.
*H01L 21/768* (2006.01)
*H01L 23/00* (2006.01)
(Continued)

(52) U.S. Cl.
CPC ........ *H01L 21/76874* (2013.01); *C23C 18/32* (2013.01); *C23C 18/42* (2013.01);
(Continued)

(58) Field of Classification Search
CPC ............. H01L 21/288; H01L 21/76874; C23C 18/1637; C23C 18/165; C23C 18/1651;
(Continued)

(56) References Cited

U.S. PATENT DOCUMENTS 6,180,505 B1 * 1/2001 Uzoh ................ H01L 23/53238
438/614
6,204,162 B1    3/2001 Yonemochi et al.
(Continued)

FOREIGN PATENT DOCUMENTS

JP    2000150702 A    5/2000
JP    2005051084 A    2/2005
(Continued)

OTHER PUBLICATIONS

International Search Report (with English translation) and Written Opinion issued in corresponding International Patent Application No. PCT/PCT/JP2018/004171, 6 pages (May 15, 2018).
(Continued)

*Primary Examiner* — Scott B Geyer
(74) *Attorney, Agent, or Firm* — Buchanan, Ingersoll & Rooney PC

(57) ABSTRACT

Provided is a semiconductor element including: a front-back conduction-type substrate including a front-side electrode and a back-side electrode; and an electroless plating layer formed on at least one of the electrodes of the front-back conduction-type substrate. The electroless plating layer includes: an electroless nickel-phosphorus plating layer; and an electroless gold plating layer formed on the electroless nickel-phosphorus plating layer, and has a plurality of recesses formed on a surface thereof to be joined with solder.

6 Claims, 5 Drawing Sheets

(51) Int. Cl.
*H01L 29/40* (2006.01)
*H01L 29/45* (2006.01)
*C23C 18/32* (2006.01)
*C23C 18/42* (2006.01)
*C23C 18/50* (2006.01)
*C23C 18/16* (2006.01)

(52) U.S. Cl.
CPC .............. *C23C 18/50* (2013.01); *H01L 24/03* (2013.01); *H01L 24/05* (2013.01); *H01L 29/401* (2013.01); *H01L 29/45* (2013.01); *C23C 18/1675* (2013.01); *C23C 18/1683* (2013.01); *H01L 2224/03464* (2013.01); *H01L 2224/04026* (2013.01); *H01L 2224/05013* (2013.01); *H01L 2224/05017* (2013.01); *H01L 2224/05073* (2013.01); *H01L 2224/05082* (2013.01); *H01L 2224/05186* (2013.01); *H01L 2224/05558* (2013.01); *H01L 2224/05573* (2013.01); *H01L 2224/05644* (2013.01)

(58) Field of Classification Search
CPC . C23C 18/1664; C23C 18/1669; C23C 18/32; C23C 18/42; C23C 18/48; C23C 18/50; C23C 18/52; C23C 18/54; C23C 18/1675; C23C 18/1676; C23C 18/1678; C23C 18/168; C23C 18/1683
See application file for complete search history.

(56) References Cited

U.S. PATENT DOCUMENTS

| | | | | |
|---|---|---|---|---|
| 8,338,954 | B2* | 12/2012 | Fujiwara | H01L 24/03 257/766 |
| 8,551,860 | B2* | 10/2013 | Bang | H01L 25/0657 438/424 |
| 2007/0264451 | A1* | 11/2007 | Yusa | C23C 18/22 428/34.1 |
| 2010/0129964 | A1* | 5/2010 | Goh | H01L 23/3107 438/124 |
| 2016/0260916 | A1* | 9/2016 | Koizumi | G03F 7/40 |
| 2016/0265115 | A1* | 9/2016 | Mukai | C23C 18/52 |
| 2018/0138135 | A1* | 5/2018 | Sunamoto | C23C 18/1844 |

FOREIGN PATENT DOCUMENTS

| | | |
|---|---|---|
| JP | 2009266935 A | 11/2009 |
| JP | 2013098228 A | 5/2013 |

OTHER PUBLICATIONS

Office Action dated Jan. 15, 2021 issued in corresponding Chinese Patent Application No. 201880010334.3, with English translation (16 pages).

\* cited by examiner

METHOD OF MANUFACTURING A SEMICONDUCTOR ELEMENT FRONT SIDE ELECTRODE

TECHNICAL FIELD

The present invention relates to a semiconductor element and a method of manufacturing the semiconductor element. More specifically, the present invention relates to a front-back conduction-type semiconductor element, particularly a power semiconductor element for power conversion typified by, for example, IGBTs (insulated gate bipolar transistors) diodes and the like, and a method of manufacturing the semiconductor element.

BACKGROUND ART

In conventional mounting of front-back conduction-type semiconductor elements on a module, a back-side electrode of the semiconductor element is soldered to a substrate or the like, and a front-side electrode of the semiconductor element is wire-bonded. However, in recent years, from the viewpoints of shortening manufacturing times and reducing material costs, mounting methods involving direct soldering of the front-side electrode of the semiconductor element and a metal electrode have increasingly been used. The front-side electrode of the semiconductor element is generally formed of aluminum or an aluminum alloy, and hence a nickel film, a gold film, or the like must be formed on the front-side electrode of the semiconductor element, in order to perform soldering.

The nickel film needs to be several µm thick as reduction thereof occurs due to reactions with tin-based solder during soldering. However, only thicknesses of at most about 1.0 µm are ordinarily achieved in cases where a vacuum deposition method such as vapor deposition or sputtering is resorted to. Moreover, excessively increasing the thickness of the nickel film translates into higher production costs. Therefore, plating techniques have gained attention as film formation methods that allow the formation of thick films quickly and at low cost.

Plating techniques include electroless plating, which allows selectively forming a plating layer only at the surface of an electrode formed of aluminum or of an aluminum alloy (hereafter referred to as an "Al electrode"). Palladium catalyst methods and zincate methods are generally resorted to as electroless plating methods.

In a palladium catalyst method, an electroless plating layer is formed by causing palladium to precipitate, as a catalyst nucleus, on the surface of an Al electrode. Although a palladium method is advantageous in that the amount of etching of the Al electrode is small and the smoothness of the surface of the electroless plating layer is good, such a method incurs higher production costs, since palladium is a noble metal.

In a zincate method, an electroless plating layer is formed by substituting zinc for Al on the surface of an Al electrode, to elicit thereby precipitation of catalyst nuclei. Zincate solutions used in this method are inexpensive, and hence the method is widely used.

Actually, Patent Document 1 proposes the feature of selectively forming a nickel plating layer and a gold plating layer, by relying on a zincate method, on the surface of an Al electrode of a semiconductor element.

CITATION LIST

Patent Document

Patent Document 1: Japanese Patent Application Laid-Open No. 2005-51084

SUMMARY OF INVENTION

Technical Problem

When a front-back conduction-type semiconductor element is mounted on a module, the back-side electrode of the semiconductor element is soldered to the substrate by placing solder on the substrate at normal temperature, and further placing the semiconductor element thereon, followed by heating the resultant in a reflow oven. At this time, gases including, for example, hydrogen and water contained in a flux in the solder and in a plating film formed on the electrode are generated. Voids become formed inside the solder when these gases remain inside the solder. Such voids inside the solder inhibit electrical conduction or thermal conduction, and hence lead to a malfunction of the semiconductor element. In order to remove the voids inside the solder, micro vibration or the like must be applied to the semiconductor element during the soldering. However, this necessitates a complicated device, and also brings about a reduction in productivity when a plurality of semiconductor elements are mounted to the substrate.

The present invention has been made to solve the above-mentioned problems, and an object of the present invention is to provide a semiconductor element in which the generation of voids inside solder can be suppressed at the time of its mounting through soldering, and a method of manufacturing the semiconductor element.

Solution to Problem

The inventors of the present invention have made extensive investigations to solve the above-mentioned problems, and as a result, have found that, when recesses are formed on a surface of an electroless plating layer, a gas, which is a cause of voids to be generated inside solder, can be easily discharged outside. Thus, the present invention has been completed.

That is, according to one embodiment of the present invention, there is provided a semiconductor element, including: a front-back conduction-type substrate including a front-side electrode and a back-side electrode; and an electroless plating layer formed on at least one of the electrodes of the front-back conduction-type substrate, wherein the at least one of the electrodes has a flat surface, and wherein the electroless plating layer includes: an electroless nickel-phosphorus plating layer formed on the at least one of the electrodes; and an electroless gold plating layer formed on the electroless nickel-phosphorus plating layer, and has recesses formed on a surface thereof to be joined with solder.

According to another embodiment of the present invention, there is provided a method of manufacturing a semiconductor element, including the steps of: forming a front-side electrode and a back-side electrode on a front-back conduction-type substrate; and sequentially forming an electroless nickel-phosphorus plating layer and an electroless gold plating layer on at least one of the front-side electrode and the back-side electrode, the step of forming the electroless nickel-phosphorus plating layer on the at least one of the electrodes including performing electroless nickel-phosphorus plating treatment while increasing at least one selected from the group consisting of a nickel concentration, a pH, a temperature, and a stirring rate of an electroless nickel-phosphorus plating solution.

According to another embodiment of the present invention, there is provided a method of manufacturing a semiconductor element, including the steps of: forming a front-side electrode and a back-side electrode on a front-back conduction-type substrate; and sequentially forming an electroless nickel-phosphorus plating layer and an electroless gold plating layer on at least one of the front-side electrode and the back-side electrode, the step of forming the electroless nickel-phosphorus plating layer on the at least one of the electrodes including performing electroless nickel-phosphorus plating treatment while changing at least one selected from the group consisting of a rocking rate and a rocking width.

According to another embodiment of the present invention, there is provided a method of manufacturing a semiconductor element, including the steps of: forming a front-side electrode and a back-side electrode on a front-back conduction-type substrate; and sequentially forming an electroless nickel-phosphorus plating layer and an electroless gold plating layer on at least one of the front-side electrode and the back-side electrode, the step of forming the electroless nickel-phosphorus plating layer on the at least one of the electrodes being followed by etching treatment on a surface of the electroless nickel-phosphorus plating layer.

According to another embodiment of the present invention, there is provided a method of manufacturing a semiconductor element, including the steps of: forming a front-side electrode and a back-side electrode on a front-back conduction-type substrate; and sequentially forming an electroless nickel-phosphorus plating layer and an electroless gold plating layer on at least one of the front-side electrode and the back-side electrode, the step of forming the electroless gold plating layer including performing electroless gold plating treatment while increasing a gold concentration of an electroless gold plating solution.

Advantageous Effects of Invention

According to the present invention, a semiconductor element in which the generation of voids inside solder can be suppressed at the time of its mounting through soldering, and a method of manufacturing the semiconductor element can be provided.

DESCRIPTION OF EMBODIMENTS

Preferred embodiments of a semiconductor element and a method of manufacturing the semiconductor element of the present invention are described below with reference to the drawings.

First Embodiment

Figure 1:
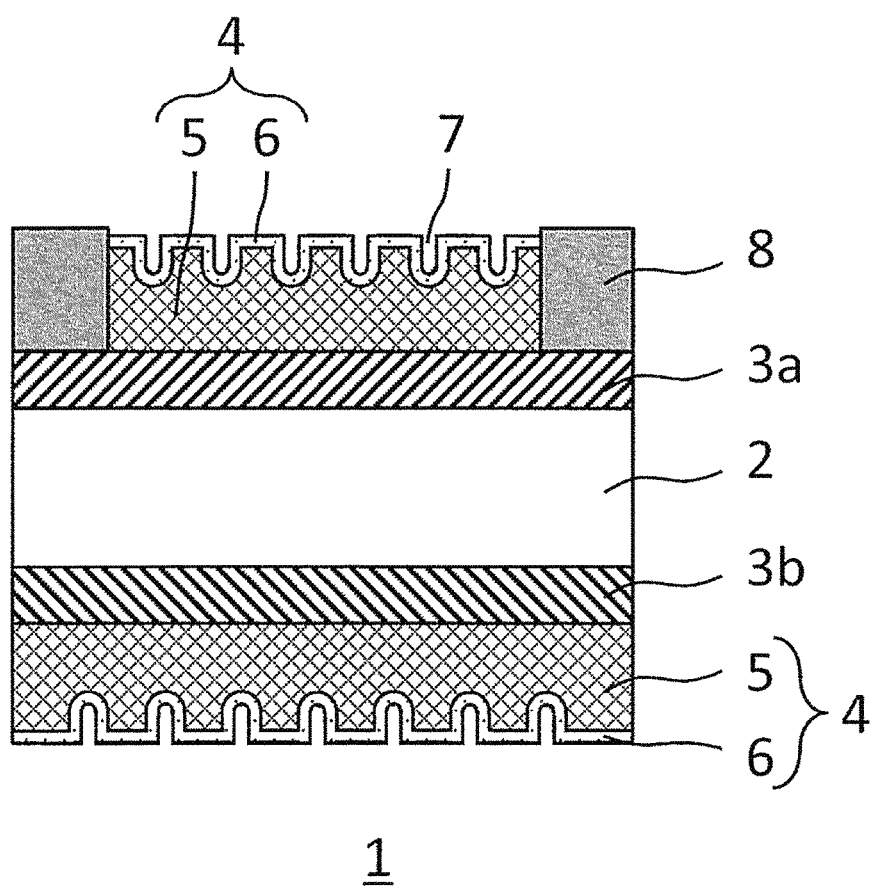
FIG. 1 is a schematic sectional view of a semiconductor element of a first embodiment.
Figure 2:
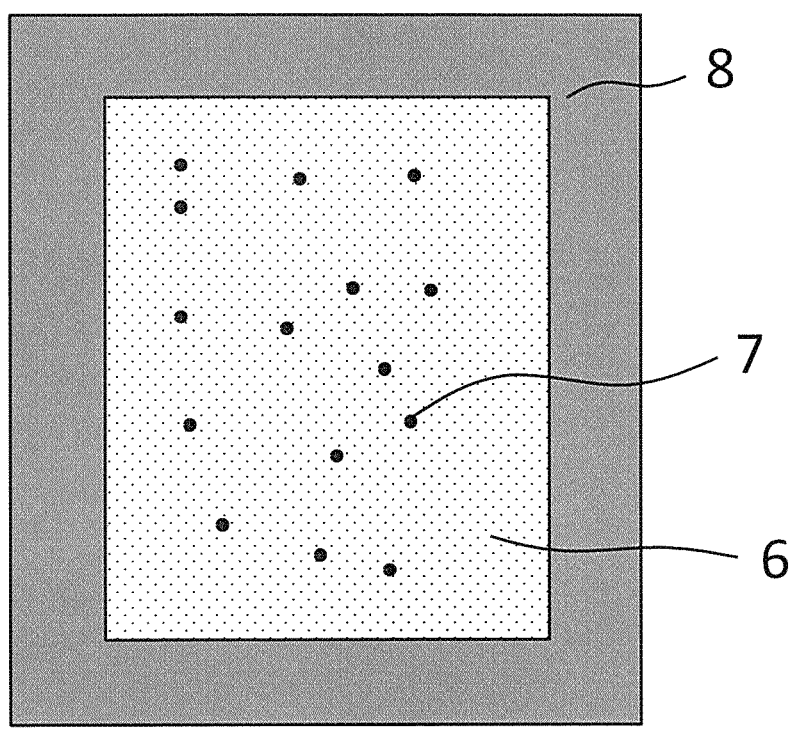
FIG. 2 is a schematic plan view of the semiconductor element of the first embodiment.

FIG. 1 is a schematic sectional view of a semiconductor element of a first embodiment. FIG. 2 is a schematic plan view of the semiconductor element of this embodiment.

In FIG. 1 and FIG. 2, a semiconductor element 1 of this embodiment includes: a front-back conduction-type substrate 2; a front-side electrode 3a formed on one main surface (front surface) of the front-back conduction-type substrate 2; a back-side electrode 3b formed on the other main surface (back surface) of the front-back conduction-type substrate 2; and electroless plating layers 4 formed on the front-side electrode 3a and the back-side electrode 3b. The electroless plating layers 4 include: electroless nickel-phosphorus plating layers 5 formed on the front-side electrode 3a and the back-side electrode 3b; and electroless gold plating layers 6 formed on the electroless nickel-phosphorus plating layers 5, and have formed on surfaces thereof a plurality of recesses 7. In addition, a protective film 8 is arranged on part of the front-side electrode 3a on which the electroless plating layer 4 is not formed.

The "recesses 7" as used herein means portions which are hollowed with respect to an outermost surface of the electroless plating layer 4.

The front-back conduction-type substrate 2 is not particularly limited, and any semiconductor substrate known in the art, such as a Si substrate, a SiC substrate, a GaAs substrate, or a GaN substrate, may be used. The front-back conduction-type substrate 2 includes a diffusion layer (not shown), and has a function of controlling the operation of the semiconductor element 1, such as a P-N junction or a gate electrode.

The front-side electrode 3a and the back-side electrode 3b are not particularly limited, and may each be formed of any material known in the art, such as aluminum or an aluminum alloy.

The aluminum alloy is not particularly limited, but preferably contains an element nobler than aluminum. When the element nobler than aluminum is incorporated therein, at the time of electroless nickel-phosphorus plating by a zincate method, electrons easily flow out of aluminum present around the element, and hence dissolution of aluminum is promoted. Then, zinc is deposited in a concentrated manner in a portion in which aluminum has been dissolved out. With this, the deposition amount of zinc serving as the origin of the formation of the electroless nickel-phosphorus plating layer 5 is increased, which facilitates the formation of the electroless nickel-phosphorus plating layer 5.

The element nobler than aluminum is not particularly limited, and examples thereof include iron, nickel, tin, lead, silicon, copper, silver, gold, tungsten, cobalt, platinum, palladium, iridium, and rhodium. Of those elements, copper, silicon, iron, nickel, silver, and gold are preferred. In addition, those elements may be used alone or in combination thereof.

The content of the element nobler than aluminum in the aluminum alloy is not particularly limited, but is preferably 5 mass % or less, more preferably 0.05 mass % or more and 3 mass % or less, still more preferably 0.1 mass % or more and 2 mass % or less.

The thickness of the front-side electrode 3a is not particularly limited, but is generally 1 µm or more and 8 µm or less, preferably 2 µm or more and 7 µm or less, more preferably 3 µm or more and 6 µm or less. In some cases, irregularities occur on the surface of the front-side electrode 3a owing to an internal electrode having a function of controlling the operation of the semiconductor element 1, such as a P-N junction or a gate electrode. In order to flatten the surface of the front-side electrode 3a, it is preferred, after the front-side electrode 3a is formed using aluminum or an aluminum alloy by a sputtering method or the like, to heat to melt the aluminum or the aluminum alloy at around a melting point. The front-side electrode 3a has, on the surface thereof on which the electroless nickel-phosphorus plating layer 5 is to be formed, a surface flatness of preferably 0.005 µm or more and 0.15 µm or less, more preferably 0.01 µm or more and 0.03 µm or less in terms of Ra value.

The "flatness" as used herein refers to a value measured with a surface stylus-type surface roughness meter or a surface stylus-type step profiler.

The thickness of the back-side electrode 3b is not particularly limited, but is generally 0.1 µm or more and 4 µm or less, preferably 0.5 µm or more and 3 µm or less, more preferably 0.8 µm or more and 2 µm or less. The back-side electrode 3b has, on the surface thereof on which the electroless nickel-phosphorus plating layer 5 is to be formed, a surface flatness of preferably 0.005 µm or more and 0.15 µm or less, more preferably 0.01 µm or more and 0.03 µm or less in terms of Ra value.

The electroless nickel-phosphorus plating layers 5 to be formed on the front-side electrode 3a and the back-side electrode 3b are not particularly limited, and plating layers having various kinds of compositions may be used. In addition, the electroless nickel-phosphorus plating layers 5 may each be an electroless nickel-phosphorus plating layer 5 having a single composition, or may be formed of a plurality of electroless nickel-phosphorus plating layers 5 having different nickel concentrations. For example, the electroless nickel-phosphorus plating layers 5 may each be formed of two or more layers having different nickel concentrations.

The nickel concentration in the electroless nickel-phosphorus plating layer is not particularly limited, but is generally 85 mass % or more, preferably 88 mass % or more and 99 mass % or less, more preferably 90 mass % or more and 98 mass % or less.

The thicknesses of the electroless nickel-phosphorus plating layers 5 to be formed on the front-side electrode 3a and the back-side electrode 3b are not particularly limited, but are each generally 2 µm or more and 10 µm or less, preferably 3 µm or more and 9 µm or less, more preferably 4 µm or more and 8 µm or less.

The thicknesses of the electroless gold plating layers 6 to be formed on the electroless nickel-phosphorus plating layers 5 are not particularly limited, but are each generally 0.1 µm or less, preferably 0.01 µm or more and 0.08 µm or less, more preferably 0.015 µm or more and 0.05 µm or less.

The shapes of the recesses 7 formed on the surface of the electroless plating layer 4 are not particularly limited, and may be various shapes. The shapes of the recesses 7 are preferably circles when seen from above. The circles preferably have small diameters, and specifically have an average diameter of preferably 0.05 µm or less, more preferably 0.008 µm or more and 0.015 µm or less. The density of the recesses 7 is preferably 10 pieces or more and 100 pieces or less, more preferably 15 pieces or more and 50 pieces or less per 100 µm$^2$ of a surface area of the electroless plating layer 4. These are experimentally obtained results. The recesses 7 formed on the surface of the electroless plating layer 4 each have a depth (difference in level) of preferably 0.05 µm or more and 1.5 µm or less, more preferably 0.1 µm or more and 1.3 µm or less from the viewpoint that a gas generated during soldering is easily discharged outside. When the recesses 7 each have a depth of less than 0.05 µm, the gas generated during soldering is difficult to discharge outside in some cases. Meanwhile, when the recesses 7 each have a depth of more than 1.5 µm, the soldering becomes difficult in some cases.

The "depth of the recesses 7" as used herein means a depth of a lowest portion of the recesses 7 with respect to the outermost surface of the electroless plating layer 4.

The protective film 8 is not particularly limited, and any protective film known in the art may be used. An example of the protective film 8 is a glass-based film containing polyimide, silicon, or the like having excellent heat resistance.

A semiconductor element 1 having the above-mentioned configuration can be manufactured in conformity with any method known in the art except for the step of forming the recesses 7 on the surface of the electroless plating layer 4.

The method of forming the recesses 7 on the surface of the electroless plating layer 4 is not particularly limited, but the following methods may be adopted: a method involving controlling the conditions of various plating treatments so that the recesses 7 may be formed on the surface of the electroless nickel-phosphorus plating layer 5; a method involving partially forming an electroless nickel-phosphorus plating layer 5 having a high nickel concentration, followed by displacing the portion through gold plating to preferentially remove the portion; and a method involving forming the electroless nickel-phosphorus plating layer 5, followed by forming the recesses 7 on the electroless nickel-phosphorus plating layer 5 by mechanical means or chemical means. An example of the mechanical means is mechanical processing using a needle, and an example of the chemical means is etching treatment.

The etching treatment may be performed by bringing the electroless nickel-phosphorus plating layer 5 into contact with an etching solution.

The etching solution is not particularly limited as long as the electroless nickel-phosphorus plating layer 5 can be etched with the etching solution, and any etching solution known in the art may be used. Examples of the etching solution include solutions containing acids, such as nitric acid, hydrochloric acid, formic acid, and oxalic acid. Of those, an etching solution containing a carboxylic acid, such as formic acid or oxalic acid, is preferred because the thickness of the electroless nickel-phosphorus plating layer 5 is less liable to be reduced and the recesses 7 are easily formed.

The acid concentration in the etching solution may be appropriately set depending on the acid to be used, but is generally 10 mass % or more and 30 mass % or less, preferably 15 mass % or more and 25 mass % or less.

The temperature of the etching solution and an etching time period during the etching treatment may be appropriately set depending on the etching solution to be used.

Other steps are generally performed as described below.

First, the front-side electrode 3a and the back-side electrode 3b are formed on the front-back conduction-type substrate 2. The method of forming the front-side electrode 3a and the back-side electrode 3b on the front-back conduction-type substrate 2 is not particularly limited, and may be performed in conformity with any method known in the art.

Next, the electroless nickel-phosphorus plating layers 5 and the electroless gold plating layers 6 are sequentially formed simultaneously on both the front-side electrode 3a and the back-side electrode 3b. This process is generally performed by a plasma cleaning step, a degreasing step, a pickling step, a first zincate treatment step, a zincate stripping step, a second zincate treatment step, an electroless nickel-phosphorus plating treatment step, and an electroless gold plating treatment step. Sufficient water washing needs to be performed between steps so that treatment solution or residue from a previous step is prevented from being brought over to a subsequent step.

In the plasma cleaning step, plasma cleaning is performed on the front-side electrode 3a and the back-side electrode 3b formed on the front-back conduction-type substrate 2. The plasma cleaning is carried out to remove organic matter residue, nitrides, or oxides firmly adhering to the front-side electrode 3a and the back-side electrode 3b through, for example, oxidative decomposition with plasma, to thereby ensure reactivity between: each of the front-side electrode 3a and the back-side electrode 3b; and a plating pretreatment solution or a plating solution. The plasma cleaning is performed on both the front-side electrode 3a and the back-side electrode 3b, but is preferably performed with emphasis on the front-side electrode 3a. In addition, the order of the plasma cleaning is not particularly limited, but the order of performing the plasma cleaning on the back-side electrode 3b and then on the front-side electrode 3a is preferred. This is because the protective film 8 formed of organic matter is present on the front side of the semiconductor element 1 together with the front-side electrode 3a, and residue from the protective film 8 often adheres to the front-side electrode 3a.

In the degreasing step, degreasing is performed on the front-side electrode 3a and the back-side electrode 3b. The degreasing is carried out to remove organic matter, oil and fat content, and oxide film mildly adhering to the surfaces of the front-side electrode 3a and the back-side electrode 3b. The degreasing is generally performed by using an alkaline chemical solution having strong etching power against the front-side electrode 3a and the back-side electrode 3b. The oil and fat content is saponified through the degreasing step. In addition, out of unsaponifiable substances, alkali-soluble substances are dissolved in the chemical solution, and alkali-insoluble substances are lifted off through etching of the front-side electrode 3a and the back-side electrode 3b.

In the pickling step, pickling is performed on the front-side electrode 3a and the back-side electrode 3b. The pickling is carried out to neutralize the surfaces of the front-side electrode 3a and the back-side electrode 3b and roughen the surfaces through etching, to thereby increase reactivity with treatment solutions in subsequent steps and increase the adhesion of plating materials.

In the first zincate treatment step, zincate treatment is performed on the front-side electrode 3a and the back-side electrode 3b.

Herein, the zincate treatment is a treatment involving forming a zinc film while removing an oxide film through etching of the surfaces of the front-side electrode 3a and the back-side electrode 3b. In general, when the front-side electrode 3a and the back-side electrode 3b are immersed in an aqueous solution in which zinc is dissolved (zincate treatment solution), aluminum is dissolved as ions because zinc has a nobler standard redox potential than aluminum or an aluminum alloy constituting the front-side electrode 3a and the back-side electrode 3b. Electrons generated at this time are received by zinc ions on the surfaces of the front-side electrode 3a and the back-side electrode 3b. Thus, zinc films are formed on the surfaces of the front-side electrode 3a and the back-side electrode 3b.

In the zincate stripping step, the front-side electrode 3a and the back-side electrode 3b having the zinc films formed on the surfaces are immersed in nitric acid, to thereby dissolve zinc.

In the second zincate treatment step, the front-side electrode 3a and the back-side electrode 3b subjected to the zincate stripping step are immersed in a zincate treatment solution again. With this, while aluminum and oxide films thereof are removed, zinc films are formed on the surfaces of the front-side electrode 3a and the back-side electrode 3b.

The reason why the above-mentioned zincate stripping step and second zincate treatment step are performed is that the surfaces of the front-side electrode 3a and the back-side electrode 3b need to be smoothened. As the number of times the zincate treatment step and the zincate stripping step are repeated is increased, the more the surfaces of the front-side electrode 3a and the back-side electrode 3b are smoothened, and the electroless nickel-phosphorus plating layers 5 and the electroless gold plating layers 6 to be formed thereon become more homogenous.

However, in consideration of balance between surface smoothness and productivity, the zincate treatment is preferably performed twice, more preferably three times.

In the electroless nickel-phosphorus plating treatment step, the front-side electrode 3a and the back-side electrode 3b having formed thereon the zinc films are immersed in an electroless nickel-phosphorus plating solution, to thereby form the electroless nickel-phosphorus plating layers 5.

The electroless nickel-phosphorus plating solution is not particularly limited, and any plating solution known in the art may be used.

The nickel concentration of the electroless nickel-phosphorus plating solution is not particularly limited, but is generally 1.0 g/L or more and 10.0 g/L or less, preferably 2 g/L or more and 8.0 g/L or less, more preferably 3 g/L or more and 6.0 g/L or less.

The hydrogen ion concentration (pH) of the electroless nickel-phosphorus plating solution is not particularly limited, but is generally 4.0 or more and 6.0 or less, preferably 4.5 or more and 5.5 or less.

During electroless nickel-phosphorus plating treatment, from the viewpoint of plating efficiency, an object to be plated may be rocked up and down. At this time, the rocking rate is not particularly limited, but is preferably 10 mm/min or more and 500 mm/min or less, preferably 30 mm/min or more and 400 mm/min or less, more preferably 50 mm/min or more and 300 mm/min or less. In addition, rocking width is also not particularly limited, but is generally 10 mm or more and 500 mm or less, preferably 30 mm or more and 300 mm or less, more preferably 50 mm or more and 200 mm or less.

The temperature of the electroless nickel-phosphorus plating solution may be appropriately set depending on, for example, the kind of electroless nickel-phosphorus plating solution and the plating conditions, but is generally 50° C. or more and 100° C. or less, preferably 60° C. or more and 95° C. or less, more preferably 70° C. or more and 90° C. or less.

The plating time period may be appropriately set depending on, for example, the plating conditions and the thickness of the electroless nickel-phosphorus plating layer 5, but is generally 5 minutes or more and 60 minutes or less, preferably 10 minutes or more and 50 minutes or less, more preferably 15 minutes or more and 40 minutes or less.

When the front-side electrode 3a and the back-side electrode 3b having formed thereon the zinc films are immersed in the electroless nickel-phosphorus plating solution, first, nickel is deposited on the front-side electrode 3a and the back-side electrode 3b because zinc has a baser standard redox potential than nickel. Subsequently, when the surfaces are coated with nickel, nickel is autocatalytically deposited by an action of a reducing agent contained in the electroless nickel-phosphorus plating solution. During the autocatalytic deposition, a component of the reducing agent (hypophosphorous acid) is incorporated in a plating film, and hence the electroless nickel-phosphorus plating layer 5 is formed as an alloy. In addition, when the concentration of the reducing agent is high, the electroless nickel-phosphorus plating layer 5 becomes amorphous. In addition, hydrogen gas is continuously generated during the electroless nickel-phosphorus plating treatment, and hence hydrogen is stored in the electroless nickel-phosphorus plating layer 5.

In the electroless gold plating treatment step, electroless gold plating treatment is performed on the front-side electrode 3a and the back-side electrode 3b having formed thereon the electroless nickel-phosphorus plating layers 5, to thereby form the electroless gold plating layers 6 thereon. The electroless gold plating treatment is generally performed by a method called displacement plating. Electroless gold displacement plating treatment is performed by displacing nickel in the electroless nickel-phosphorus plating layer 5 by gold by the action of a complexing agent contained in an electroless gold plating solution.

The electroless gold plating solution is not particularly limited, and any plating solution known in the art may be used. The gold concentration of the electroless gold plating solution is not particularly limited, but is generally 1.0 g/L or more and 5 g/L or less, preferably 1.2 g/L or more and 4 g/L or less, more preferably 1.5 g/L or more and 3 g/L or less.

The pH of the electroless gold plating solution is not particularly limited, but is generally 6.0 or more and 7.0 or less.

The temperature of the electroless gold plating solution may be appropriately set depending on, for example, the kind of electroless gold plating solution and the plating conditions, but is generally 50° C. or more and 100° C. or less, preferably 70° C. or more and 100° C. or less, more preferably 80° C. or more and 95° C. or less.

The plating time period may be appropriately set depending on, for example, the plating conditions and the thickness of the electroless gold plating layer 6, but is generally 5 minutes or more and 60 minutes or less, preferably 10 minutes or more and 50 minutes or less, more preferably 15 minutes or more and 40 minutes or less.

In the electroless gold plating treatment, the reaction stops when the surface of the electroless nickel-phosphorus plating layer 5 is coated with gold. It is therefore difficult to increase the thickness of the electroless gold plating layer 6, and the thickness of the electroless gold plating layer 6 to be formed is at most 0.08 µm and is generally about 0.05 µm. However, even the above-mentioned value for the thickness of the electroless gold plating layer 6 is not excessively small when the electroless gold plating layer 6 is utilized for soldering.

Figure 3:
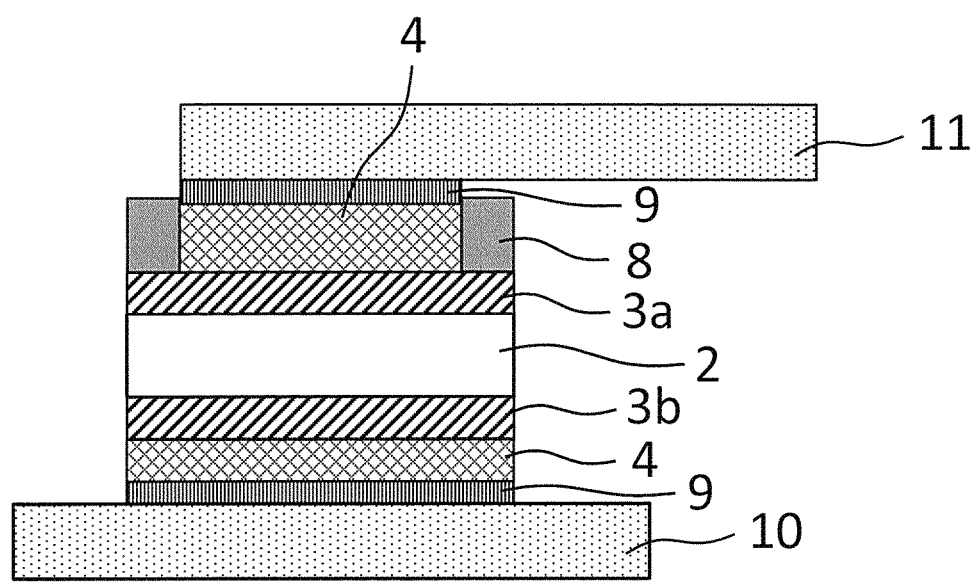
FIG. 3 is a schematic sectional view of the semiconductor element of the first embodiment after the semiconductor element is joined with solder to a heat dissipation substrate and an external terminal.

FIG. 3 is a schematic sectional view of the semiconductor element after the electroless plating layers 4 of the semiconductor element 1 described above are joined with solder 9 to a heat dissipation substrate 10 and an external terminal 11. The solder 9 is not particularly limited, and any solder known in the art, such as tin-silver-copper solder, may be used. The thickness of the solder is preferably 0.1 µm or more and 5 µm or less, more preferably 1 µm or more and 3 µm or less. As the heat dissipation substrate 10, any heat dissipation substrate known in the art may be used. The external terminal 11 is preferably a terminal formed of an inexpensive metal having low electrical resistance, and is more preferably a terminal formed of copper or a copper alloy.

In the semiconductor element 1 having the above-mentioned configuration, in which the recesses 7 are formed on the surfaces of the electroless plating layers 4, gas generated at the time of mounting of the semiconductor element 1 to a module through soldering can be easily discharged outside through the recesses 7, and the generation of voids inside the solder can be suppressed.

Second Embodiment

In a second embodiment, a suitable method of manufacturing the semiconductor element 1 of the first embodiment is described.

The manufacturing method of this embodiment includes the same basic steps as the manufacturing method of the first embodiment, and hence only differences therefrom are described.

In electroless gold plating treatment, nickel in an electroless nickel-phosphorus plating layer 5 is dissolved in an electroless gold plating solution, and an electroless gold plating layer 6 is formed by displacement between nickel and gold. At this time, as the nickel concentration of the electroless nickel-phosphorus plating layer 5 becomes larger, the amount of nickel dissolved in the electroless nickel-phosphorus plating layer 5 becomes larger. Moreover, as the amount of nickel dissolved in the electroless nickel-phosphorus plating layer 5 becomes larger, the recesses 7 are more easily formed on the surface of the electroless nickel-phosphorus plating layer 5.

In order to increase the nickel concentration of the electroless nickel-phosphorus plating layer 5, it is appropriate to adjust the conditions of electroless nickel-phosphorus plating treatment. Specifically, the nickel concentration of the electroless nickel-phosphorus plating layer 5 may be controlled by adjusting various conditions, such as the nickel concentration, the hydrogen ion concentration (pH), the temperature, and the stirring rate of an electroless nickel-phosphorus plating solution to be used for the electroless nickel-phosphorus plating treatment. For example, the nickel concentration of the electroless nickel-phosphorus plating layer 5 may be increased by increasing the nickel concentration, the hydrogen ion concentration (pH), the temperature, or the stirring rate of the electroless nickel-phosphorus plating solution.

In view of the foregoing, in the method of manufacturing the semiconductor element 1 of this embodiment, the step of forming the electroless nickel-phosphorus plating layers 5 on the front-side electrode 3a and the back-side electrode 3b by the zincate method includes performing the electroless nickel-phosphorus plating treatment while increasing at least one selected from the group consisting of the nickel concentration, the pH, the temperature, and the stirring rate of the electroless nickel-phosphorus plating solution.

Figure 4:
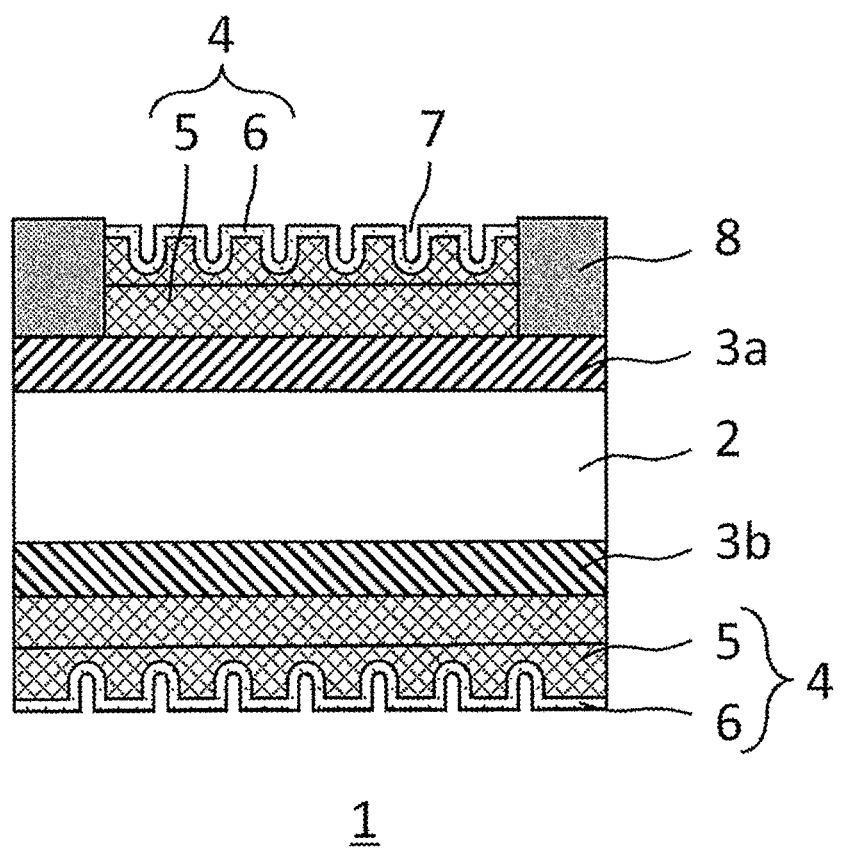
FIG. 4 is a schematic sectional view of a semiconductor element of a second embodiment.

A schematic sectional view of a semiconductor element 1 produced by the method of manufacturing the semiconductor element 1 of this embodiment in which at least one condition selected from the group consisting of the nickel concentration, the pH, the temperature, and the stirring rate of the electroless nickel-phosphorus plating solution is increased once in the course of the electroless nickel-phosphorus plating treatment is illustrated in FIG. 4. In the semiconductor element 1, the electroless nickel-phosphorus plating layers 5 are each formed so as to have a structure including two layers having different nickel concentrations, and an electroless nickel-phosphorus plating layer 5 on an electroless gold plating layer 6 side has a higher nickel concentration than an electroless nickel-phosphorus plating layer 5 on a front-side electrode 3a side or a back-side electrode 3b side. In FIG. 4, the two layers are clearly distinguished for ease of understanding, but attention needs to be paid to the fact that, in some cases, the two layers are not clearly distinguished because, in a region around a boundary between the two layers, the nickel concentration is sequentially increased from the front-side electrode 3a side or the back-side electrode 3b side toward the electroless gold plating layer 6 side.

The nickel concentration of the electroless nickel-phosphorus plating layer 5 on the electroless gold plating layer 6 side is not particularly limited, but is preferably 94 mass % or more and 99 mass % or less, more preferably 95 mass % or more and 98 mass % or less.

In addition, the nickel concentration of the electroless nickel-phosphorus plating layer 5 on the front-side electrode 3a side or the back-side electrode 3b side is not particularly limited, but is preferably 90 mass % or more and less than 94 mass %, more preferably 91 mass % or more and less than 93 mass %.

The thickness of the electroless nickel-phosphorus plating layer 5 on the electroless gold plating layer 6 side is not particularly limited, but is preferably 2.0 µm or more and 7.0 µm or less, more preferably 2.5 µm or more and 6.0 µm or less.

In addition, the thickness of the electroless nickel-phosphorus plating layer 5 on the front-side electrode 3a side or the back-side electrode 3b side is not particularly limited, but is preferably 1.5 µm or more and 7.0 µm or less, more preferably 2.0 µm or more and 6.0 µm or less.

When the semiconductor element 1 having the configuration illustrated in FIG. 4 is manufactured, it is appropriate to, for example, adjust the nickel concentration and the pH of the electroless nickel-phosphorus plating solution to 4.0 g/L or more and 5.0 g/L or less and 4.0 or more and 5.0 or less, respectively, in order to form the electroless nickel-phosphorus plating layer 5 on the front-side electrode 3a side or the back-side electrode 3b side, and to adjust the nickel concentration and the pH of the electroless nickel-phosphorus plating solution to 5.0 g/L or more and 6.0 g/L or less and 5.0 or more and 6.0 or less, respectively, in order to form the electroless nickel-phosphorus plating layer 5 on the electroless gold plating layer 6 side.

According to the method of manufacturing the semiconductor element 1 of this embodiment, the electroless nickel-phosphorus plating layer 5 having a higher nickel concentration can be formed on a surface by controlling various conditions, such as the nickel concentration, the hydrogen ion concentration (pH), the temperature, and the stirring rate of the electroless nickel-phosphorus plating solution to be used for the electroless nickel-phosphorus plating treatment, and thus the recesses 7 can be formed on the surface of the electroless nickel-phosphorus plating layer 5 during the electroless gold plating treatment. This eliminates the need for a separate step of forming the recesses 7 on the surface of the electroless nickel-phosphorus plating layer 5 (e.g., treatment step involving using mechanical means or chemical means).

Third Embodiment

In a third embodiment, a suitable method of manufacturing the semiconductor element 1 of the first embodiment is described.

The manufacturing method of this embodiment includes the same basic steps as the manufacturing method of the first embodiment, and hence only differences therefrom are described.

During electroless nickel-phosphorus plating treatment, a hydrogen gas is generated, and hence hydrogen gas bubbles adhere to the surface of an electroless nickel-phosphorus plating layer 5 having been deposited. The hydrogen gas bubbles microscopically reduce the deposition efficiency of the electroless nickel-phosphorus plating layer 5. Therefore, the thickness of the electroless nickel-phosphorus plating layer 5 is liable to become smaller in portions to which the hydrogen gas bubbles adhere than in portions to which the hydrogen gas bubbles do not adhere.

In view of the foregoing, in the method of manufacturing the semiconductor element 1 of this embodiment, the step of forming the electroless nickel-phosphorus plating layers 5 on the front-side electrode 3a and the back-side electrode 3b by the zincate method includes performing the electroless nickel-phosphorus plating treatment while changing at least one selected from the group consisting of rocking rate and rocking width.

When at least one selected from the group consisting of rocking rate and rocking width is changed as described above, the deposition amount of the electroless nickel-phosphorus plating layer 5 can be controlled, and thus the recesses 7 are easily formed on the surface of the electroless nickel-phosphorus plating layer 5.

When the semiconductor element 1 of this embodiment is manufactured, it is appropriate to, for example, change at least one selected from the group consisting of rocking rate and rocking width once or more in the course of the electroless nickel-phosphorus plating treatment. The rocking rate and the rocking width may be changed by, for example, repetitively turning the rocking on and off. At this time, when a rocking stop (off) time period is excessively long, the electroless nickel-phosphorus plating layer 5 is liable to be peeled off owing to reduction in its adhesiveness to the front-side electrode 3a or the back-side electrode 3b in some cases. Accordingly, from the viewpoint of ensuring the adhesiveness of the electroless nickel-phosphorus plating layer 5 to the front-side electrode 3a or the back-side electrode 3b, it is appropriate to set the rocking stop (off) time period to preferably less than 3 minutes, more preferably 2 minutes or less, still more preferably 1 minute or less.

The amount of change in the rocking rate is not particularly limited, but is generally 50 mm/min or more and 500 mm/min or less, preferably 100 mm/min or more and 400 mm/min or less, more preferably 200 mm/min or more and 300 mm/min or less. In addition, the amount of change in the rocking width is not particularly limited, but is generally 10 mm or more and 300 mm or less, preferably 30 mm or more and 200 mm or less, more preferably 50 mm or more and 100 mm or less.

According to the method of manufacturing the semiconductor element 1 of this embodiment, the recesses 7 can be formed on the surface of the electroless nickel-phosphorus plating layer 5 by controlling at least one selected from the group consisting of the rocking rate and the rocking width during the electroless nickel-phosphorus plating treatment. This eliminates the need for a separate step of forming the recesses 7 on the surface of the electroless nickel-phosphorus plating layer 5 (e.g., treatment step involving using mechanical means or chemical means).

Fourth Embodiment

In a fourth embodiment, a suitable method of manufacturing the semiconductor element 1 of the first embodiment is described.

The manufacturing method of this embodiment includes the same basic steps as the manufacturing method of the first embodiment, and hence only differences therefrom are described.

In electroless gold plating treatment, nickel in an electroless nickel-phosphorus plating layer 5 is dissolved into an electroless gold plating solution, and an electroless gold plating layer 6 is formed through displacement between nickel and gold. Therefore, when the electroless gold plating treatment is performed while the gold concentration of the electroless gold plating solution is controlled, etching treatment of the electroless nickel-phosphorus plating layer 5 and the formation of the electroless gold plating layer 6 can be performed through the electroless gold plating treatment.

In view of the foregoing, in the method of manufacturing the semiconductor element 1 of this embodiment, the step of forming the electroless gold plating layer 6 includes performing the electroless gold plating treatment while increasing the gold concentration of the electroless gold plating solution. For example, it is appropriate that the electroless gold plating treatment be performed by using two kinds of electroless gold plating solutions having different gold concentrations, and include electroless gold plating treatment with one of the electroless gold plating solutions having a lower gold concentration, followed by electroless gold plating treatment with the other of the electroless gold plating solutions having a higher gold concentration. Instead of the electroless gold plating solution having a lower gold concentration, a nickel etching solution in which the gold concentration is zero may be used to perform the etching treatment.

When such electroless gold plating treatment is performed, mainly the recesses 7 are formed on the surface of the electroless nickel-phosphorus plating layer 5 through the etching treatment using the nickel etching solution in which the gold concentration is zero or the electroless gold plating treatment using the electroless gold plating solution having a lower gold concentration, and the electroless gold plating layer 6 is formed on the surface of the electroless nickel-phosphorus plating layer 5 through the electroless gold plating treatment using the electroless gold plating solution having a higher gold concentration.

The specific gold concentration of the electroless gold plating solution having a lower gold concentration is not particularly limited, but is generally 0.5 g/L or less, preferably 0.4 g/L or less, more preferably 0.3 g/L or less. In addition, the specific gold concentration of the electroless gold plating solution having a higher gold concentration is not particularly limited, but is generally 1.0 g/L or more and 5 g/L or less, preferably 1.2 g/L or more and 4 g/L or less, more preferably 1.5 g/L or more and 3 g/L or less.

According to the method of manufacturing the semiconductor element 1 of this embodiment, the etching treatment of the electroless nickel-phosphorus plating layer 5 and the formation of the electroless gold plating layer 6 can be collectively performed by controlling the gold concentration of the electroless gold plating solution used for the electroless gold plating treatment. This eliminates the need for a separate step of forming the recesses 7 on the surface of the electroless nickel-phosphorus plating layer 5 (e.g., treatment step involving using mechanical means or chemical means).

Fifth Embodiment

Figure 5:
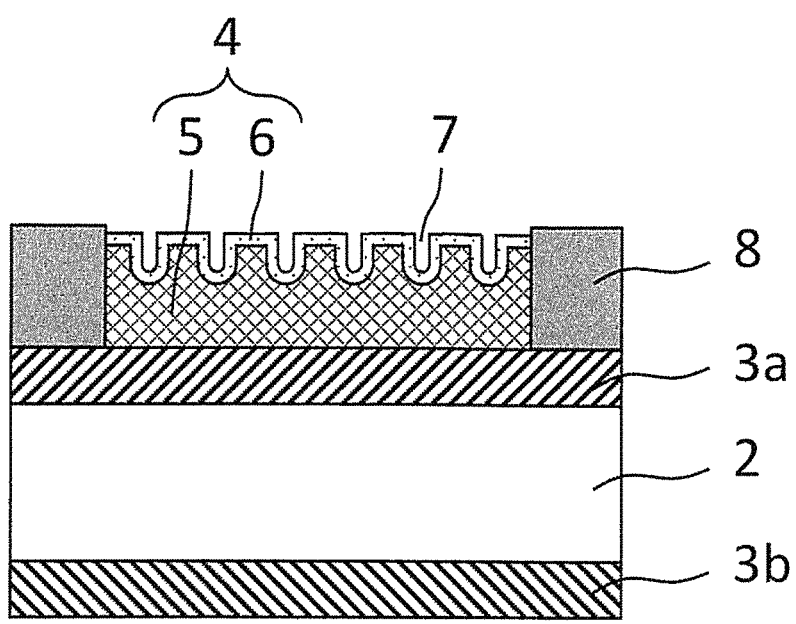
FIG. 5 is a schematic sectional view of a semiconductor element of a fifth embodiment.

FIG. 5 is a schematic sectional view of a semiconductor element of a fifth embodiment.

In FIG. 5, a semiconductor element 1 of this embodiment includes: a front-back conduction-type substrate 2; a front-side electrode 3a formed on one main surface (front surface) of the front-back conduction-type substrate 2; a back-side electrode 3b formed on the other main surface (back surface) of the front-back conduction-type substrate 2; and an electroless plating layer 4 formed on the front-side electrode 3a. The electroless plating layer 4 includes: an electroless nickel-phosphorus plating layer 5 formed on the front-side electrode 3a; and an electroless gold plating layer 6 formed on the electroless nickel-phosphorus plating layer 5, and has formed on a surface thereof a plurality of recesses 7. In addition, a protective film 8 is arranged on part of the front-side electrode 3a on which the electroless plating layer 4 is not formed. That is, the semiconductor element 1 of this embodiment has the same configuration as the semiconductor element 1 of the first embodiment except that the electroless plating layer 4 is not formed on the back-side electrode 3b. In this embodiment, the electroless plating layer 4 having the plurality of recesses 7 is formed only on the front-side electrode 3a. The manufacturing method of this embodiment includes the same basic steps as the manufacturing method of the first embodiment, and hence only differences therefrom are described.

Before performing plating treatments, a protective film is attached to the back-side electrode 3b so that the back-side electrode 3b is prevented from being brought into contact with plating solutions. After the electroless plating layer 4 is formed, the semiconductor element 1 may be dried, and the protective film may be peeled off. The protective film is not particularly limited, and a UV releasable tape for plating step protection may be used.

The semiconductor elements 1 of the above-mentioned embodiments may each be manufactured by subjecting a chip (front-back conduction-type substrate 2) obtained through dicing of a semiconductor wafer to the plating treatments, or, from the viewpoint of productivity or the like, by subjecting the semiconductor wafer to the plating treatments, followed by dicing. In particular, in recent years, from the viewpoint of improving the electrical characteristics of the semiconductor element 1, a reduction in thickness of the front-back conduction-type substrate 2 has been required, and handling sometimes becomes difficult unless the semiconductor wafer has a larger thickness in its periphery than in its center. With the above-mentioned plating treatments, desired plating films can be formed on such semiconductor wafer having different thicknesses in its center and in its periphery.

EXAMPLES

The present invention is hereinafter described in detail by way of Examples. However, the present invention is by no means limited thereto.

Example 1

In Example 1, a semiconductor element 1 having a configuration illustrated in FIG. 4 was produced.

First, a Si substrate (14 mm×14 mm×70 µm) was prepared as a front-back conduction-type substrate 2.

Next, an aluminum alloy electrode (thickness: 5.0 µm) serving as a front-side electrode 3a and a protective film 8 were formed on a front surface of the Si substrate, and an aluminum alloy electrode (thickness: 1.0 µm) serving as a back-side electrode 3b was formed on a back surface of the Si substrate. The front-side electrode 3a had a surface flatness of 0.025 µm in terms of Ra value, and the back-side electrode 3b had a surface flatness of 0.015 µm in terms of Ra value.

Next, steps were performed under the conditions shown in Table 1 and Table 2 below to obtain the semiconductor element 1. Water washing using pure water was performed between the steps.

TABLE 1

| Step | Item | Conditions etc. |
|---|---|---|
| 1 | Plasma cleaning | Ar (100 cc/min), 800 W, 2 min, degree of vacuum: 10 Pa |
| 2 | Degreasing | Alkaline degreasing solution, pH 9.5, 70° C., 3 min |
| 3 | Pickling | 10% Sulfuric acid, 30° C., 1 min |
| 4 | First zincate treatment | Alkaline zincate treatment solution, pH 12, 25° C., 20 sec |
| 5 | Zincate stripping | Nitric acid, 25° C., 15 sec |
| 6 | Second zincate treatment | Alkaline zincate treatment solution, pH 12, 25° C., 20 sec |
| 7 | Electroless nickel-phosphorus plating treatment | Acidic electroless nickel-phosphorus plating solution, plating treatment conditions are shown in Table 2 |
| 8 | Electroless gold plating treatment | Acidic electroless gold plating solution, pH 6.5, 90° C., 30 min |

TABLE 2

| Sample No. | Plating time period (min) | Ni concentration in plating solution (g/L) | pH of plating solution | Temperature of plating solution (° C.) | Rocking rate (mm/min) | Rocking width (mm) | Category |
|---|---|---|---|---|---|---|---|
| 1-1 | 0 to 25 | 5.0 | 5.0 | 85 | 300 | 100 | Comparative Example |
| 1-2 | 0 to 15 | 5.0 | 5.0 | 85 | 300 | 100 | Example of the present invention |
|  | 15 to 20 | 5.0 | 5.0→5.5 | 85 | 300 | 100 |  |
|  | 20 to 25 | 5.0 | 5.5 | 85 | 300 | 100 |  |
| 1-3 | 0 to 15 | 5.0 | 5.0 | 85 | 300 | 100 | Example of the present invention |
|  | 15 to 20 | 5.0→5.5 | 5.0→5.5 | 85 | 300 | 100 |  |
|  | 20 to 25 | 5.5 | 5.5 | 85 | 300 | 100 |  |
| 1-4 | 0 to 15 | 5.0 | 5.0 | 85 | 300 | 100 | Example of the present invention |
|  | 15 to 16 | 5.0→5.5 | 5.0→5.5 | 85 | 300 | 100 |  |
|  | 16 to 25 | 5.5 | 5.5 | 85 | 300 | 100 |  |
| 1-5 | 0 to 24 | 4.8 | 5.0 | 85 | 300 | 100 | Example of the present invention |
|  | 24 to 26 | 4.8→5.5 | 5.0→5.3 | 85 | 300 | 100 |  |
|  | 26 to 32 | 5.5 | 5.3 | 85 | 300 | 100 |  |

The thicknesses of electroless nickel-phosphorus plating layers 5 and electroless gold plating layers 6 formed on the front-side electrode 3a and the back-side electrode 3b were each measured with a commercially available fluorescent X-ray thickness meter. As a result, in all samples, the electroless gold plating layers 6 each had a thickness of 0.03 µm. In addition, the results of the thicknesses of the electroless nickel-phosphorus plating layers 5 are shown in Table 3.

In addition, the nickel concentrations of the electroless nickel-phosphorus plating layers 5 were each measured by dissolving the electroless nickel-phosphorus plating layer 5 in water containing an acid or an alkali, followed by ICP. The results are shown in Table 3.

Further, the presence or absence of recesses 7 formed on the surface of an electroless plating layer 4 formed of the electroless nickel-phosphorus plating layer 5 and the electroless gold plating layer 6 was confirmed with an optical microscope or a laser microscope, and the depth thereof was measured based on the amount of change in tube focus position. The results are shown in Table 3.

TABLE 3

| Sample No. | Thickness of electroless nickel-phosphorus plating layer (μm) | | Ni concentration of electroless nickel-phosphorus plating layer (mass %) | | Presence or absence of recesses | Depth of recesses (μm) | Category |
|---|---|---|---|---|---|---|---|
| | Electroless gold plating layer side | Electrode side | Electroless gold plating layer side | Electrode side | | | |
| 1-1 | 5.0 | | 93 | | Absent | 0 | Comparative Example |
| 1-2 | 3.0 | 2.5 | 95 | 93 | Present | 0.20 | Example of the present invention |
| 1-3 | 3.0 | 3.0 | 96 | 93 | Present | 0.25 | Example of the present invention |
| 1-4 | 2.9 | 3.8 | 97 | 92 | Present | 0.45 | Example of the present invention |
| 1-5 | 3.5 | 3.2 | 95 | 91 | Present | 0.30 | Example of the present invention |

As shown in Table 3, in each of Sample Nos. 1-2 to 1-5, in which the electroless nickel-phosphorus plating treatment was performed while the nickel concentration and/or the pH of the electroless nickel-phosphorus plating solution was increased, the recesses 7 were formed on the surface of the electroless plating layer 4. Meanwhile, in Sample No. 1-1, in which the electroless nickel-phosphorus plating treatment was performed while the nickel concentration and the pH of the electroless nickel-phosphorus plating solution were kept constant, recesses 7 were not formed on the surface of the electroless plating layer 4.

Example 2

In Example 2, a semiconductor element 1 was produced in the same manner as in Example 1 except that the conditions of electroless nickel-phosphorus plating treatment were changed as shown in Table 4.

TABLE 4

| Sample No. | Plating time period (min) | Ni concentration in plating solution (g/L) | pH of plating solution | Temperature of plating solution (° C.) | Rocking rate (mm/min) | Rocking width (mm) | Category |
|---|---|---|---|---|---|---|---|
| 2-1 | 0 to 25 | 5.0 | 5.0 | 85 | 300 | 100 | Comparative Example |
| 2-2 | 0 to 20 | 5.0 | 5.0 | 85 | 300 | 100 | Example of the present invention |
| | 20 to 21 | 5.0 | 5.0 | 85 | 300→50 | 100 | |
| | 21 to 25 | 5.0 | 5.0 | 85 | 50 | 100 | |
| 2-3 | 0 to 21 | 5.0 | 5.0 | 85 | 300 | 100 | Example of the present invention |
| | 21 to 21.1 | 5.0 | 5.0 | 85 | 300→0 | 100→0 | |
| | 21.1 to 21.4 | 5.0 | 5.0 | 85 | 0 | 0 | |
| | 21.4 to 21.5 | 5.0 | 5.0 | 85 | 0→300 | 0→100 | |
| | 21.5 to 26 | 5.0 | 5.0 | 85 | 300 | 100 | |
| 2-4 | 0 to 15 | 5.0 | 5.0 | 85 | 300 | 100 | Example of the present invention |
| | 15 to 15.1 | 5.0 | 5.0 | 85 | 300→0 | 100→0 | |
| | 15.1 to 16 | 5.0 | 5.0 | 85 | 0 | 0 | |
| | 16 to 16.1 | 5.0 | 5.0 | 85 | 0→300 | 0→100 | |
| | 16.1 to 26 | 5.0 | 5.0 | 85 | 300 | 100 | |

The thicknesses of electroless nickel-phosphorus plating layers 5 and electroless gold plating layers 6 formed on the front-side electrode 3a and the back-side electrode 3b were measured in the same manner as in Example 1. As a result, in all samples, the electroless gold plating layers 6 each had a thickness of 0.03 μm. The results of the thicknesses of the electroless nickel-phosphorus plating layer 5 are shown in Table 3.

In addition, the nickel concentrations of the electroless nickel-phosphorus plating layers 5 were measured in the same manner as in Example 1. As a result, in all samples, the nickel concentrations of the electroless nickel-phosphorus plating layers 5 were 93 mass %.

Further, the presence or absence of recesses 7 formed on the surface of an electroless plating layer 4 formed of the electroless nickel-phosphorus plating layer 5 and the electroless gold plating layer 6 was confirmed and the depth thereof was measured in the same manner as in Example 1. The results are shown in Table 5.

TABLE 5

| Sample No. | Thickness of electroless nickel-phosphorus plating layer (μm) | Presence or absence of recesses | Depth of recesses (μm) | Category |
|---|---|---|---|---|
| 2-1 | 5.0 | Absent | 0 | Comparative Example |
| 2-2 | 4.0 | Present | 0.25 | Example of the present invention |
| 2-3 | 4.0 | Present | 0.30 | Example of the present invention |
| 2-4 | 3.2 | Present | 0.40 | Example of the present invention |

As shown in Table 5, in each of Sample Nos. 2-2 to 2-4, in which the electroless nickel-phosphorus plating treatment was performed while the rocking rate and/or the rocking width was changed, the recesses 7 were formed on the surface of the electroless plating layer 4. Meanwhile, in Sample No. 2-1, in which the nickel-phosphorus plating treatment was performed while the rocking rate and the rocking width were kept constant, recesses 7 were not formed on the surface of the electroless plating layer 4.

Example 3

In Example 3, a semiconductor element 1 was produced in the same manner as in Example 1 except that steps were performed under the conditions shown in Table 6 and Table 7 below.

TABLE 6

| Step | Item | Conditions etc. |
|---|---|---|
| 1 | Plasma cleaning | Ar (100 cc/min), 800 W, 2 min, degree of vacuum: 10 Pa |
| 2 | Degreasing | Alkaline degreasing solution, pH 9.5, 70° C., 3 min |
| 3 | Pickling | 10% Sulfuric acid, 30° C., 1 min |
| 4 | First zincate treatment | Alkaline zincate treatment solution, pH 12, 25° C., 20 sec |
| 5 | Zincate stripping | Nitric acid, 25° C., 15 sec |
| 6 | Second zincate treatment | Alkaline zincate treatment solution, pH 12, 25° C., 20 sec |
| 7 | Electroless nickel-phosphorus plating treatment | Acidic electroless nickel-phosphorus plating solution, pH 12, 85° C., 25 min, without rocking |
| 8 | Etching treatment | Shown in Table 7 |
| 9 | Electroless gold plating treatment | Acidic electroless gold plating solution, pH 6.5, 90° C., 30 min |

TABLE 7

| Sample No. | Kind of acid | Concentration of acid (mass %) | Etching temperature (° C.) | Etching time period (min) | Category |
|---|---|---|---|---|---|
| 3-1 | — | — | — | — | Comparative Example |
| 3-2 | Nitric acid | 20 | 25 | 5 | Example of the present invention |
| 3-3 | Hydrochloric acid | 17.5 | 40 | 5 | Example of the present invention |
| 3-4 | Formic acid | 20 | 40 | 5 | Example of the present invention |
| 3-5 | Oxalic acid | 20 | 40 | 5 | Example of the present invention |

The thicknesses of electroless nickel-phosphorus plating layers 5 and electroless gold plating layers 6 formed on a front-side electrode 3a and a back-side electrode 3b were measured in the same manner as in Example 1. As a result, in all samples, the electroless gold plating layers 6 each had a thickness of 0.03 μm. In addition, while the thickness of the electroless nickel-phosphorus plating layer 5 was 5.0 μm in each of Sample Nos. 3-1, 3-4, and 3-5, the thickness of the electroless nickel-phosphorus plating layer 5 was 4.7 μm (reduced by 0.3 μm through the etching treatment) in Sample No. 3-2 and 4.8 μm (reduced by 0.2 μm through the etching treatment) in Sample No. 3-3.

In addition, the nickel concentrations of the electroless nickel-phosphorus plating layers 5 were measured in the same manner as in Example 1. As a result, in all samples, the nickel concentrations of the electroless nickel-phosphorus plating layers 5 were 93 mass %.

Further, the presence or absence of recesses 7 formed on the surface of an electroless plating layer 4 formed of the electroless nickel-phosphorus plating layer 5 and the electroless gold plating layer 6 was confirmed and the depth thereof was measured in the same manner as in Example 1. The results are shown in Table 8.

TABLE 8

| Sample No. | Presence or absence of recesses | Depth of recesses (μm) | Category |
|---|---|---|---|
| 3-1 | Absent | 0 | Comparative Example |
| 3-2 | Present | 0.1 | Example of the present invention |
| 3-3 | Present | 0.25 | Example of the present invention |
| 3-4 | Present | 0.5 | Example of the present invention |
| 3-5 | Present | 0.3 | Example of the present invention |

As shown in Table 8, in each of Sample Nos. 3-2 to 3-5, in which the surface of the electroless nickel-phosphorus plating layer 5 was subjected to the etching treatment, the recesses 7 were formed on the surface of the electroless plating layer 4. Meanwhile, in Sample No. 3-1, in which the surface of the electroless nickel-phosphorus plating layer 5 was not subjected to the etching treatment, recesses 7 were not formed on the surface of the electroless plating layer 4.

Example 4

In Example 4, a semiconductor element 1 was produced in the same manner as in Example 1 except that steps were performed under the conditions shown in Table 9 and Table 10 below.

TABLE 9

| Step | Item | Conditions etc. |
|---|---|---|
| 1 | Plasma cleaning | Ar (100 cc/min), 800 W, 2 min, degree of vacuum: 10 Pa |
| 2 | Degreasing | Alkaline degreasing solution, pH 9.5, 70° C., 3 min |
| 3 | Pickling | 10% Sulfuric acid, 30° C., 1 min |
| 4 | First zincate treatment | Alkaline zincate treatment solution, pH 12, 25° C., 20 sec |
| 5 | Zincate stripping | Nitric acid, 25° C., 15 sec |
| 6 | Second zincate treatment | Alkaline zincate treatment solution, pH 12, 25° C., 20 sec |
| 7 | Electroless nickel-phosphorus plating treatment | Acidic electroless nickel-phosphorus plating solution, pH 12, 85° C., 25 min, without rocking |
| 8 | Electroless gold plating treatment | Acidic electroless gold plating solution, plating treatment conditions shown in Table 10 |

TABLE 10

| Sample No. | Plating time period (min) | Au concentration in plating solution (g/L) | pH of plating solution | Temperature of plating solution (° C.) | Category |
|---|---|---|---|---|---|
| 4-1 | 0 to 30 | 1.5 | 6.5 | 90 | Comparative Example |
| 4-2 | 0 to 15 | 0 | 6.5 | 90 | Example of the present invention |
|  | 15 to 30 | 1.5 | 6.5 | 90 |  |
| 4-3 | 0 to 5 | 0 | 6.5 | 90 | Example of the present invention |
|  | 5 to 6 | 0→1.5 | 6.5 | 90 |  |
|  | 6 to 35 | 1.5 | 6.5 | 90 |  |
| 4-4 | 0 to 10 | 0 | 6.5 | 90 | Example of the present invention |
|  | 10 to 11 | 0→1.5 | 6.5 | 90 |  |
|  | 11 to 40 | 1.5 | 6.5 | 90 |  |
| 4-5 | 0 to 20 | 0 | 6.5 | 90 | Example of the present invention |
|  | 20 to 21 | 0→1.5 | 6.5 | 90 |  |
|  | 21 to 50 | 1.5 | 6.5 | 90 |  |

The thicknesses of electroless nickel-phosphorus plating layers 5 and electroless gold plating layers 6 formed on the front-side electrode 3a and the back-side electrode 3b were measured in the same manner as in Example 1. As a result, in all samples, the electroless nickel-phosphorus plating layers 5 each had a thickness of 5.0 µm. The results of the thicknesses of the electroless gold plating layers 6 are shown in Table 11.

In addition, the nickel concentrations of the electroless nickel-phosphorus plating layers 5 were measured in the same manner as in Example 1. As a result, in all samples, the nickel concentrations of the electroless nickel-phosphorus plating layers 5 were 93 mass %.

Further, the presence or absence of recesses 7 formed on the surface of an electroless plating layer 4 formed of the electroless nickel-phosphorus plating layer 5 and the electroless gold plating layer 6 was confirmed and the depth thereof was measured in the same manner as in Example 1. The results are shown in Table 11.

TABLE 11

| Sample No. | Thickness of electroless nickel-phosphorus plating layer (µm) | Presence or absence of recesses | Depth of recesses (µm) | Category |
|---|---|---|---|---|
| 4-1 | 0.05 | Absent | 0 | Comparative Example |
| 4-2 | 0.04 | Present | 0.1 | Example of the present invention |
| 4-3 | 0.05 | Present | 0.23 | Example of the present invention |
| 4-4 | 0.04 | Present | 0.55 | Example of the present invention |
| 4-5 | 0.02 | Present | 1.1 | Example of the present invention |

As shown in Table 11, in each of Sample Nos. 4-2 to 4-5, in which the electroless gold plating treatment was performed while the gold concentration of the electroless gold plating solution was increased, the recesses 7 were formed on the surface of the electroless plating layer 4. Meanwhile, in Sample No. 4-1, in which the electroless gold plating treatment was performed while the gold concentration of the electroless gold plating solution was kept constant, recesses 7 were not formed on the surface of the electroless plating layer 4.

From the above-mentioned results, it is revealed that, according to the present invention, the semiconductor element 1 in which the generation of voids inside solder can be suppressed at the time of its mounting through soldering, and the method of manufacturing the semiconductor element can be provided.

Example 5

In Example 5, a semiconductor element 1 was produced in the same manner as in Example 1 except that steps were performed after a protective film was attached to a back-side electrode 3b so that the back-side electrode 3b was prevented from being brought into contact with plating solutions, and then the semiconductor element was dried, and the protective film was peeled off.

With this, the same effects as in Example 1 can be exhibited in the front-side electrode 3a.

The present international application claims priority based on Japanese Patent Application No. 2017-025804 filed on Feb. 15, 2017, the contents of which are incorporated herein by reference in their entirety.

EXPLANATION ON NUMERALS 1 semiconductor element, 2 front-back conduction-type substrate, 3a front-side electrode, 3b back-side electrode, 4 electroless plating layer, 5 electroless nickel-phosphorus plating layer, 6 electroless gold plating layer, 7 recess, 8 protective film, 9 solder, 10 heat dissipation substrate, 11 external terminal

The invention claimed is:

1. A method of manufacturing a semiconductor element, comprising the steps of:
   forming a front-side electrode on a front-back conduction-type substrate; and
   sequentially forming an electroless nickel-phosphorus plating layer and an electroless gold plating layer on the front-side electrode,
   wherein the step of forming the electroless nickel-phosphorus plating layer on the front-side electrode comprises performing an electroless nickel-phosphorus plating treatment while increasing at least one selected from the group consisting of a nickel concentration, a pH, and a stirring rate of an electroless nickel-phosphorus plating solution.

2. The method of manufacturing a semiconductor element according to claim 1, wherein the step of forming the electroless nickel-phosphorus plating layer is performed by a zincate method.

3. The method of manufacturing a semiconductor element according to claim 1, wherein the method further comprises a step of, after forming the front-side electrode using aluminum or an aluminum alloy, heating to melt the aluminum or the aluminum alloy, to thereby flatten surfaces of the front-side electrode.

4. A method of manufacturing a semiconductor element, comprising the steps of:

forming a front-side electrode on a front-back conduction-type substrate; and sequentially forming an electroless nickel-phosphorus plating layer and an electroless gold plating layer on the front-side electrode, wherein the step of forming the electroless nickel-phosphorus plating layer on the front-side electrode comprises performing an electroless nickel-phosphorus plating treatment while changing at least one selected from the group consisting of a rocking rate and a rocking width.

5. The method of manufacturing a semiconductor element according to claim 4, wherein the step of forming the electroless nickel-phosphorus plating layer is performed by a zincate method.

6. The method of manufacturing a semiconductor element according to claim 4, wherein the method further comprises a step of, after forming the front-side electrode using aluminum or an aluminum alloy, heating to melt the aluminum or the aluminum alloy, to thereby flatten surfaces of the front-side electrode.

* * * * *